United States Patent

Schemmann et al.

[11] Patent Number: 5,812,578
[45] Date of Patent: Sep. 22, 1998

[54] RADIATION-EMITTING INDEX-GUIDED SEMICONDUCTOR DIODE

[75] Inventors: Marcel F. C. Schemmann; Carolus J. Van Der Poel; Gerard A. Acket, all of Eindhoven, Netherlands

[73] Assignee: U.S. Philips Corporation, New York, N.Y.

[21] Appl. No.: 491,201

[22] Filed: Jun. 16, 1995

[30] Foreign Application Priority Data

Jun. 2, 1994 [EP] European Pat. Off. .............. 94201753

[51] Int. Cl.[6] ........................................................ H01S 3/19
[52] U.S. Cl. .................................................. 372/46; 372/44
[58] Field of Search .................................. 372/46, 45, 44, 372/43

[56] References Cited

U.S. PATENT DOCUMENTS

| | | | |
|---|---|---|---|
| 4,745,612 | 5/1988 | Hayakawa et al. | 372/45 |
| 5,276,699 | 1/1994 | Kahen | 372/45 |
| 5,289,484 | 2/1994 | Hayakawa | 372/45 |
| 5,295,148 | 3/1994 | Mori et al. | 372/45 |
| 5,404,370 | 4/1995 | Otsubo et al. | 372/45 |
| 5,416,790 | 5/1995 | Yodoshi et al. | 372/45 |
| 5,436,923 | 7/1995 | Nagai | 372/45 |
| 5,553,089 | 9/1996 | Seki et al. | 372/43 |
| 5,586,136 | 12/1996 | Honda et al. | 372/45 |
| 5,600,667 | 2/1997 | Kidoguchi et al. | 372/45 |

OTHER PUBLICATIONS

"High Power and Low Optical Feedback Noise AlGaAs Single Quantum Well Lasers" by M. Nido et al, Electron. Lett. 16th Feb. 1989, vol. 25, No. 4, pp. 277–278.

"High Power and Low Optical Feedback Noise AlGaAs Single Quantum Well Lasers", Electronic Letters, vol. 25, No. 4, Feb. 1989.

Primary Examiner—Rodney B. Bovernick
Assistant Examiner—Ellen E. Kang
Attorney, Agent, or Firm—Daniel E. Tierney

[57] ABSTRACT

A radiation-emitting semiconductor diode, especially a laser having a first and a second cladding layer, an active layer and a mesa which comprises at least the second cladding layer and which lies recessed in a third cladding layer. The second cladding layer comprises a first sub-layer which adjoins the active layer and is comparatively thin, and a second sub-layer which adjoins the first sub-layer and is comparatively thick, while the refractive index of the first sub-layer is lower than that of the second sub-layer. Confinement in the thickness direction of charge carriers and radiation is good in such a diode, while the third cladding layer has a relatively high refractive index (giving a relatively low bandgap). Thus, the third cladding layer has a relatively low aluminium content, while providing good lateral confinement.

13 Claims, 1 Drawing Sheet

RADIATION-EMITTING INDEX-GUIDED SEMICONDUCTOR DIODE

BACKGROUND OF THE INVENTION

The invention relates to a radiation-emitting semiconductor diode, in particular a semiconductor diode laser, comprising a semiconductor body with a semiconductor substrate on which a semiconductor layer structure is present comprising a first cladding layer of a first conductivity type, an active layer, and a second cladding layer of a second conductivity type opposed to the first, while the substrate and the second cladding layer are provided with electrical connections and a strip-shaped region is present which comprises a major portion of the second cladding layer and which is laterally bounded on either side by a third cladding layer.

Such a diode is used as a radiation source in the form of an LED (=Light Emitting Diode) or a laser in, for example, information processing systems such as laser printers, optical disc systems such as Compact Disc (Video) (CD(V)), or Digital Optical Recording (DOR) systems, or bar code readers in which information is written and/or read. In addition, diode lasers are used in glass fibre communication systems, for example as pumping lasers.

Such a diode is known from "High power and low optical feedback noise AlGaAs single quantum well lasers" by. M. Nido et al., Electron. Lett. 16th February 1989, vol. 25, no. 4, pp. 277–278. FIG. 1 of this publication shows such a diode which is of the so-called buried ridge type here and which is manufactured in the GaAs/AlGaAs material system. The first and the second cladding layer, comprising AlGaAs, have a lower refractive index and a greater bandgap than the active layer which here comprises a GaAs quantum well layer arranged between two thin radiation-transmitting AlGaAs layers. The third cladding layer, at the same time a current blocking layer, here comprises GaAs and absorbs a portion of the radiation emitted by the laser on either side of the ridge. This absorption results in a comparatively great step in the effective refractive index in lateral direction, so that the lateral confinement of radiation in the active layer is adequate.

A disadvantage of the known diode is that the above absorption adversely affects the efficiency, and thus the starting current of a laser. A third cladding layer comprising AlGaAs does not have this disadvantage, or at least to a much lesser extent. The disadvantage of the replacement of GaAs with AlGaAs, however, is that the third cladding layer then must have a very low refractive index, corresponding to a very high aluminium content, in order to obtain a lateral step in the effective refractive index which is sufficiently great for a stable laser operation. In the known laser, the third cladding layer would then have to have, for example, at least 55 to 70 at. % aluminium. The manufacture of AlGaAs layers, however, and especially the selective deposition thereof, is not feasible when these layers have such a high aluminium content.

SUMMARY OF THE INVENTION

The present invention has for its object inter alia to obtain a radiation-emitting diode, in particular a diode laser, which does not have the above disadvantage or at least to a much lesser extent, and which has a sufficiently great lateral step in the effective refractive index and is also easy to manufacture.

A radiation-emitting semiconductor diode of the kind mentioned in the opening paragraph, according to the invention, is characterized in that the second cladding layer comprises a first sub-layer which adjoins the active layer and is comparatively thin and a second sub-layer which adjoins the first sub-layer and which is comparatively thick, the refractive index of the first sub-layer being lower than that of the second sub-layer. Thanks to the first sub-layer of low refractive index—and accordingly with a high bandgap— the confinement in the thickness direction of the charge carriers, and to a lesser degree of the generated radiation, is sufficiently great in spite of the fact that this layer is comparatively thin, i.e. has a thickness which is, for example, no more than 0.2 times the thickness of the second cladding layer. The second sub-layer which comprises, for example, the remaining and major portion of the second cladding layer, still contributes to said confinement in the thickness direction thanks to its comparatively great thickness and in spite of its comparatively high refractive index, so that this confinement is sufficient in all directions. The subdivision in this way of the second cladding layer into sub-layers, wherein a comparatively large portion of the second cladding layer has a comparatively high refractive index, means that the third cladding layer need not have such a low refractive index in order to obtain a sufficiently great lateral step in the effective refractive index. This means, when the third cladding layer contains aluminium, that the laser according to the invention is stable with a comparatively low aluminium content of this layer, that it has a low starting current, and most of all that it is easy to manufacture. An additional, important advantage is that a third cladding layer of low aluminium content has a better heat conduction than one with a high aluminium content. A diode according to the invention thus has a better lateral cooling, which benefits the starting current, stability, and useful life. The advantage of a third cladding layer of comparatively high refractive index, however, is not limited to layers containing aluminium. It is advantageous also in other material systems for the third cladding layer to be able to have a comparatively high refractive index because this leads to a higher degree of freedom in the choice of material for the third cladding layer. Thus, for example, a third cladding layer of InGaP may be used, which matches a GaAs substrate and accordingly has a gallium content of approximately 50 at. %, whereas in a known laser a gallium content of more than 50 at. % would be necessary, which would mean that this layer no longer matches GaAs. Since the third cladding layer is comparatively thick (approximately 1 $\mu$m), such a mismatch leads to a tension which is fatal to the laser.

The first cladding layer is allowed to have a comparatively low refractive index throughout its thickness, for example, the same as the first sub-layer. Favourable results are also obtained when the first cladding layer is subdivided into two sub-layers in the same manner as the second cladding layer.

A particularly favourable embodiment of a diode according to the invention is characterized in that the refractive index of the third cladding layer lies between those of the first and the second sub-layers. Such a diode may have a lateral step in the effective refractive index which lies between approximately $1 \times 10^{-3}$ and approximately $7 \times 10^{-3}$, which is amply sufficient for a stable operation. In the case of a third cladding layer comprising AlGaAs, this may be realised with an aluminium content which is below 50 or even 40 at. %, depending on the refractive indices of the other cladding layers and the wavelength of the emitted radiation. Preferably, therefore, a diode according to the invention has a lateral step in the effective refractive index which lies in said region. An optimum value for said quantity lies between approximately 3×10⁻³ and approximately 5×10⁻³.

In a preferred embodiment of a diode according to the invention, the first and second cladding layers comprise AlGaAs, and the aluminium content of the first sub-layer is greater than that of the second sub-layer, while the third cladding layer comprises AlGaAs with an aluminium content which lies between that of the first and that of the second sub-layer. Such a diode has a lateral step in the effective refractive index which lies in said region, is easy to manufacture, and is very well suitable for the wavelength region between approximately 0.7 and 1.0 μm which is important in practice.

In a first favourable modification, the aluminium content of the first sub-layer lies between 40 and 70 at. % and its thickness between 0.03 and 0.2 μm, the aluminium content of the second sub-layer lies between 30 and 40 at. % and its thickness between 1 and 3 μm, the aluminium content of the third cladding layer lies between 40 and 50 at. %, and the wavelength of the emission of the active layer is approximately 0.78 μm. The aluminium percentages and thicknesses given above correspond to the above preferred domain of the lateral step in the effective refractive index for the emission wavelength specified. The diode according to this modification, when constructed as a laser, is particularly suitable for use as a read and/or write laser in an optical disc system.

In a second, also favourable modification, the aluminium content of the first sub-layer lies between 30 and 50 at. % and its thickness between 0.03 and 0.2 μm, the aluminium content of the second sub-layer lies between 15 and 30 at. % and its thickness between 1 and 3 μm, the aluminium content of the third cladding layer lies between 20 and 40 at. %, and the wavelength of the emission of the active layer is approximately 0.98 μm. These aluminium percentages and thicknesses also correspond to said preferred domain of the lateral step in the effective refractive index for the emission wavelength specified. The diode in this modification, when constructed as a laser, is particularly suitable for use as a pumping laser for an (erbium-doped) glass fibre amplifier.

A very favourable embodiment of a diode according to the invention has the buried ridge structure. The strip-shaped region, i.e. the ridge, then comprises a major portion of the second cladding layer, but not the entire second cladding layer. This structure is very attractive because the active layer is no longer exposed to the atmosphere after its growth, which is highly desirable when the active layer comprises aluminium. In addition, this structure is comparatively simple to manufacture.

In a modification of this structure, the portion of the second cladding layer situated on either side of the ridge comprises besides the first sub-layer a small portion of the second sub-layer. This structure has the advantage that the provision of the third cladding layer takes place on a layer having a comparatively low aluminium content, which benefits the quality of the third cladding layer. This modification demands a good homogeneity of the thickness of the layers situated above the first sub-layer, and an accurate etching thereof. This modification can be very well realised with the use of OMVPE (=Organo Metallic Vapour Phase Epitaxy) as the deposition technique and etching means having a very low etching rate. Within this modification, it is also possible to use an intermediate layer situated in the second sub-layer and adjacent the first sub-layer. The intermediate layer may act as an etching stopper layer and preferably comprises a layer without aluminium, for example, a layer comprising InGaP or GaAs.

As is apparent from the above, the present invention is particularly well applicable to diodes which emit in the wavelength range below approximately 1 μm. The invention is accordingly highly suitable for the InGaP/InAlGaP material system as well as for the GaAs/AlGaAs material system. Combinations of these material systems could also be envisaged here.

BRIEF DESCRIPTION OF THE DRAWINGS

The invention will now be explained in more detail with reference to three embodiments and the accompanying drawing, in which.

Figure 1:
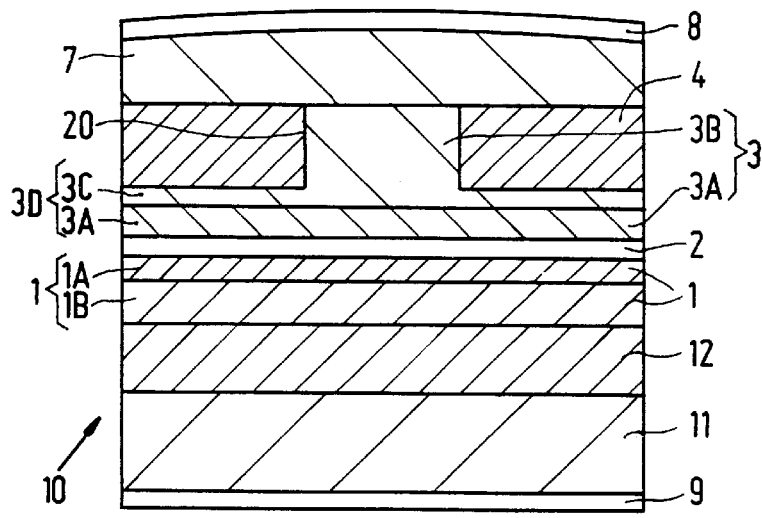
FIG. 1 is a cross-section of a first and a second embodiment of a radiation-emitting semiconductor diode according to the invention.

The Figures are diagrammatic and not drawn to scale, the dimensions in the thickness direction being particularly exaggerated for the sake of clarity. Corresponding parts have been given the same reference numerals as a rule in the various embodiments. Semiconductor regions of the same conductivity type have been generally hatched in the same direction.

DESCRIPTION OF THE PREFERRED EMBODIMENTS

FIG. 1 shows in cross-section a first embodiment of a radiation-emitting semiconductor diode, here a diode laser, according to the invention. The cross-section is taken perpendicular to the longitudinal direction of the resonance cavity of the laser. The device comprises a semiconductor body 10 with a substrate 11 of n-GaAs. A semiconductor layer structure is provided thereon, comprising inter alia a buffer layer 12 of n-GaAs, a first cladding layer 1 of n-AlGaAs, an active layer 2 of AlGaAs with three quantum well layers separated by barrier layers and surrounded by radiation-guiding layers, and a second cladding layer 3 of p-AlGaAs. The semiconductor body 10 comprises a strip-shaped region 20, here in the form of a ridge 20, which comprises a major portion of the second cladding layer 3 and which is bounded on either side by a third cladding layer 4 also acting as a current-blocking layer 4, also made of AlGaAs and here of the n-conductivity type. The substrate 11 is provided with a metal layer 9, and the ridge 20 is provided with a contact layer 7 of p-GaAs with a metal layer 8 thereon, so that the laser can be connected electrically.

According to the invention, the second cladding layer 3 comprises a first sub-layer 3A which adjoins the active layer 2 and is relatively thin, and a second sub-layer 3B which adjoins the first sub-layer 3A and which is relatively thick, while the refractive index of the first sub-layer 3A is lower than that of the second sub-layer 3B. As a result, on the one hand the confinement in the active layer 2 of the charge carriers and the generated radiation, here radiation with a wavelength of approximately 0.78 μm, is comparatively good, while on the other hand the effective refractive index at the area of the ridge 20 is comparatively high. This means that the third cladding layer 4 need not have such a low refractive index for nevertheless realising a comparatively great lateral step in the effective refractive index. In the present example, the first cladding layer 1 is also subdivided into two sub-layers 1A, 1B in an analogous manner.

In the present example of a GaAs/AlGaAs laser, this implies that the first sub-layer 1A, 3A have a higher aluminium content than the second sub-layer 1B, 3B. The aluminium content of the first sub-layers 3A lies between 40 and 70 at. %, and is approximately 55 at. % here, while that of the second sub-layer 3B lies between 30 and 40 at. %, and is approximately 35 at. % here. The thicknesses of said sub-layers 1A, 3A and 1B, 3B, which lie between 0.03 and 0.2 μm, and between 1 and 3 μm, respectively, in the present example are 0.05 μm and 1.3 μm, respectively. As a result of this, and also since a third cladding layer 4 here comprises only 45 at. % aluminium, the laser in this example according to the invention exhibits a comparatively great lateral step in the effective refractive index, i.e. a step between $1 \times 10^{-3}$ and $7 \times 10^{-3}$, and preferably between $3 \times 10^{-3}$ and $5 \times 10^{-3}$, in this case approximately $4 \times 10^{-3}$. A third cladding layer 4 with such a low aluminium content can be readily provided selectively, so that the laser according to this embodiment can be readily realised. The emission wavelength in this example is 0.78 and the diode, constructed as a laser, is highly suitable as a read and/or write laser in an optical disc system.

This embodiment of the laser is of the buried ridge type and is on that account easy to manufacture. Such a laser also has the major advantage that the active layer 2 is not exposed to the atmosphere during manufacture. This is especially important if the material of the active layer 2 changes irreversibly and adversely upon exposure to the atmosphere, such as the active layer 2 comprising aluminium of this embodiment. In this embodiment, therefore, a portion 3D of the second cladding layer 3 situated on either side of the ridge 20 comprises besides the first sub-layer 3A also a small portion 3C, here approximately 0.1 μm thick, of the second sub-layer 3B. The third cladding layer 4 accordingly is present on a layer with a comparatively low aluminium content, which facilitates the application of the third cladding layer 4 and improves the quality thereof. The Table below lists the compositions, doping levels, and thicknesses of the various semiconductor layers of the laser in this embodiment.

| Layer | Semi-conductor | Type | Doping concentr. (at/cm³) | Thickness (μm) |
|---|---|---|---|---|
| 11 | GaAs (substrate) | N | $2 \times 10^{18}$ | 350 |
| 12 | GaAs | N | $2 \times 10^{18}$ | 0.1 |
| 1B | $Al_{0.35}Ga_{0.65}As$ | N | $2 \times 10^{18}$ | 1.3 |
| 1A | $Al_{0.55}Ga_{0.45}As$ | N | $5 \times 10^{17}$ | 0.05 |
| 2 | $Al_{0.27}Ga_{0.73}GaAs$ | — | — | 0.12 |
|  | $(Al_{0.10}Ga_{0.90}As$ | — | — | 0.0085 |
|  | $Al_{0.27}Ga_{0.73}As)*2$ | — | — | 0.01 |
|  | Al | — | — | 0.0085 |
|  | $Al_{0.27}Ga_{0.73}GaAs$ | — | — | 0.12 |
| 3A | $Al_{0.55}Ga_{0.45}As$ | P | $5 \times 10^{17}$ | 0.05 |
| 3B | $Al_{0.35}Ga_{0.65}As$ | P | $2 \times 10^{18}$ | 1.3 |
| 4 | $Al_{0.45}Ga_{0.55}As$ | N | $1 \times 10^{18}$ | 1.2 |
| 7 | GaAs | P | $2 \times 10^{18}$ | 0.5 |

The width and length of the ridge 20 are 3.5 and 250 μm, respectively. The conductive layer 9 on the substrate 11 here comprises Au—Ge—Ni and is approximately 0.1 μm thick. The conductive layer 8 here comprises Pt, Ta, and Au and is approximately 0.4 μm thick.

The radiation-emitting semiconductor diode described is manufactured as follows (see FIGS. 2 and 3). The following are grown in that order on an n-GaAs substrate 1 by means of MOVPE (=Metal Organic Vapour Phase Epitaxy): a 0.5 μm thick buffer layer 12 of n-GaAs, a second sub-layer 1B and a first sub-layer 1A of a first cladding layer 1 of nAlGaAs, comprising 35 and 55 at. % aluminium, respectively, a non-doped active layer 2 of AlGaAs with three quantum well layers situated between two radiation-guiding layers alternating with barrier layers, a first sub-layer 3A and a second sub-layer 3B of a second cladding layer 3 of P-AlGaAs with 55 and 35 at. % aluminium, respectively. A 0.12 μm thick masking layer 30 of silicon dioxide in the form of a strip 30 whose longitudinal axis is perpendicular to the plane of drawing is provided thereon.

Figure 2:
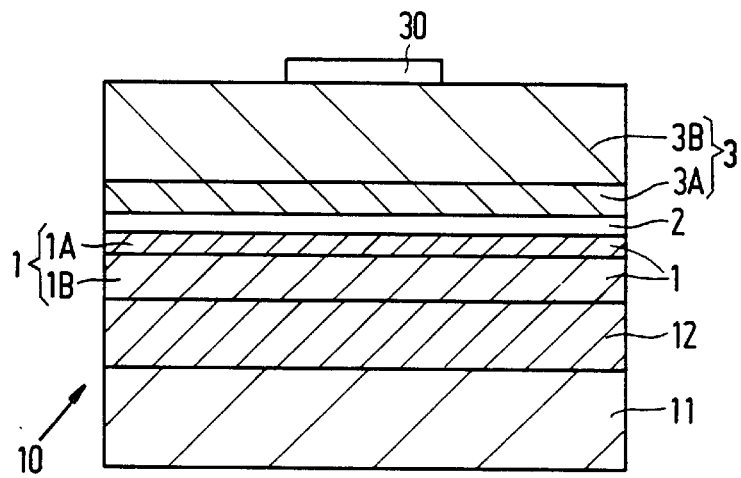
FIGS. 2 and 3 show the diode of FIG. 1 in subsequent stages of its manufacture.
Figure 3:
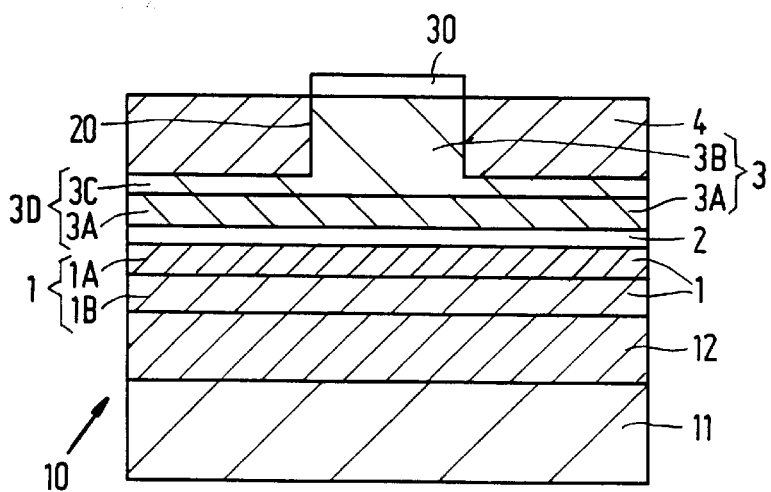

Then a mesa-shaped strip 20 is etched into the semiconductor layer structure of FIG. 2 (see FIG. 3), whereby the second cladding layer 3 comprising AlGaAs is removed for the major part by means of an etchant with a low etching rate. Owing to a very good homogeneity of the thickness of the second cladding layer 3 and said low etching rate thereof, the thickness of the remaining portion 3D of the second cladding layer, comprising the first sub-layer 3A and a 0.1 μm thick portion 3C of the second sub-layer 3B, can be chosen in a very controlled manner.

After this, also by means of MOVPE, a third cladding layer 4 of n-AlGaAs is provided selectively on either side of the mesa-shaped strip 20 on the second cladding layer 3. After the mask 30 has been removed, a contact layer 7 of p-GaAs is provided non-selectively (see FIG. 1). The chosen thicknesses and compositions of the semiconductor layers provided can further be found in the Table above. Then a conductive layer 8 is provided on the substrate 1 by means of, for example, sputtering, and a conductive layer 8 is provided on the contact layer 7 in an analogous manner. The individual lasers are available for final mounting after cleaving.

FIG. 1 also shows a cross-section of a second embodiment of a radiation-emitting semiconductor diode, here also a diode laser, according to the invention. The differences with the first embodiment exclusively relate to the compositions or thicknesses of the first, second and third cladding layers 2, 3, 4, which here have different aluminium contents, and of the active layer 2, of which the emission wavelength is 0.98 μm here. The compositions and thicknesses of the layers of the laser of this embodiment are given in the Table below. For the other aspects, which do not differ from those of the first embodiment, reference is made to the description of this first embodiment.

| Layer | Semi-conductor | Type | Doping concentr. (at/cm³) | Thickness (μm) |
|---|---|---|---|---|
| 1B | $Al_{0.18}Ga_{0.82}As$ | N | $2 \times 10^{18}$ | 1.9 |
| 1A | $Al_{0.40}Ga_{0.60}As$ | N | $5 \times 10^{17}$ | 0.05 |
| 2 | GaAs | — | — | 0.12 |
|  | $In_{0.20}Ga_{0.80}As$ | — | — | 0.004 |
|  | GaAs | — | — | 0.005 |
|  | $In_{0.20}Ga_{0.80}As$ | — | — | 0.004 |
|  | GaAs | — | — | 0.12 |
| 3A | $Al_{0.40}Ga_{0.60}As$ | P | $5 \times 10^{17}$ | 0.05 |
| 3B | $Al_{0.18}Ga_{0.82}As$ | P | $2 \times 10^{18}$ | 1.9 |
| 4 | $Al_{0.25}Ga_{0.75}As$ | N | $1 \times 10^{18}$ | 1.8 |

In this example the second cladding layer 3 according to the invention again comprises a first sub-layer 3A adjoining the active layer and relatively thin, and a second sub-layer 3B adjoining the first sub-layer 3A and relatively thick, while the refractive index of the first sub-layer 3A is lower than that of the second sub-layer 3B. As a result, on the one hand the confinement of charge carriers and of the 0.98 μm radiation in the active layer 2 is comparatively good, while on the other hand the effective refractive index at the area of the ridge 20 is comparatively high. This means that the third cladding layer 4 need not have such a low refractive index in order to realise nevertheless a comparatively great lateral step in the effective refractive index. In this example the first cladding layer 1 is again split up into two sub-layers 1A, 1B in an analogous manner.

In the present example of an InGaAs/AlGaAs laser, this implies that the first sub-layer 1A, 3A have a higher aluminium content than the second sub-layers 1B, 3B. The aluminium content of the first sub-layer 1A, 3A lies between 30 and 50 at. %, and here is approximately 40 at. %, while that of the second sub-layer 1B, 3B lies between 15 and 30 at. %, and here is approximately 18 at. %. The thicknesses of said sub-layers 1A, 3A and 1B, 3B, which lie between 0.03 and 0.2 $\mu$m and between 1 and 3 $\mu$m, respectively, in this example are 0.05 $\mu$m and 1.9 $\mu$m, respectively. As a result of this, and because a third cladding layer 4 here comprises only 25 at. % aluminium, the laser according to this embodiment of the invention exhibits a comparatively great lateral step in the effective refractive index, i.e. a step which lies between $1\times10^{-3}$ and $7\times10^{-3}$, preferably between $3\times10^{-3}$ and $5\times10^{-3}$, and which here is approximately $4\times10^{-3}$. A third cladding layer 4 with such a low aluminium content is particularly easy to provide selectively, so that the laser in this embodiment is readily realised. Said emission wavelength of 0.98 $\mu$m renders this embodiment of the laser particularly suitable as a pumping laser for an (erbium-doped) glass fibre amplifier.

The laser of this example is manufactured in the same manner as the laser of the first example. As to this manufacture, a reference to the first example suffices.

The invention is not limited to the embodiments given, since many modifications and variations are possible to those skilled in the art within the scope of the invention. The invention may be applied not only to lasers but also to LEDs, while the third cladding layer may be constructed as a high-ohmic layer instead of as a blocking pn junction so as to avoid current through this layer.

Neither is the invention limited to the ridge laser mentioned in the examples. The invention may be used in other structures as well, such as especially so-called buried heterostructures. Furthermore, the invention may be used in diodes in semiconductor material systems other than those mentioned here, such as the InGaP/InGaAlP system already mentioned, and the invention may even be used in aluminium-free III–V material systems such as InGaAsP or material systems other than III–V, such as the II–VI material system.

Finally, it should be noted that alternative techniques can be used instead of the MOVPE used for the semiconductor layers in the embodiments. Thus it is also possible to use MOMBE (=Metal Organic Molecular Beam Epitaxy), MBE (=Molecular Beam Epitaxy), VPE (=Vapour Phase Epitaxy), or LPE (=Liquid Phase Epitaxy) instead of MOVPE.

We claim:

1. A radiation-emitting semiconductor diode comprising a semiconductor body with a semiconductor substrate on which a semiconductor layer structure is present comprising a first cladding layer of a first conductivity type, an active layer, and a second cladding layer of a second conductivity type opposed to the first, while the substrate and the second cladding layer are provided with electrical connections and a strip-shaped region is present which comprises a major portion of the second cladding layer and which is laterally bounded on either side by a third cladding layer, characterized in that the second cladding layer comprises a first sub-layer which adjoins the active layer and is comparatively thin and a second sub-layer which adjoins the first sub-layer and which is comparatively thick, the refractive index of the first sub-layer being lower than that of the second sub-layer, the refractive index of the third cladding layer lying between those of the first and the second sub-layers of the second cladding layer.

2. A radiation-emitting semiconductor diode as claimed in claim 1, characterized in that also the first cladding layer comprises a first sub-layer which adjoins the active layer and is comparatively thin, and a second sub-layer which adjoins the first sub-layer and is comparatively thick, while the refractive index of the first sub-layer is lower than that of the second sub-layer.

3. A radiation-emitting semiconductor diode as claimed in claim 2, wherein the refractive index of the third cladding layer lies between the refractive indices of the first and second sub-layers of the first cladding layer.

4. A radiation-emitting semiconductor diode as claimed in claim 1, characterized in that the lateral step in the effective refractive index between the strip-shaped region and the portions of the third cladding layer adjoining thereto lies between $1\times10^{-3}$ and $7\times10^{-3}$, and preferably lies between approximately $3\times10^{-3}$ and $5\times10^{-3}$.

5. A radiation-emitting semiconductor diode as claimed in claim 1, characterized in that the first and second cladding layers comprise AlGaAs, and the aluminium content of the first sub-layer of the second cladding layer is greater than that of the second sub-layer of the second cladding layer, while the third cladding layer comprises AlGaAs with an aluminium content which lies between that of the first and that of the second sub-layer of the second cladding layer.

6. A radiation-emitting semiconductor diode as claimed in claim 5, characterized in that the aluminium content of the first sub-layer of the second cladding layer lies between 40 and 70 at. % and its thickness between 0.03 and 0.2 $\mu$m, the aluminium content of the second sub-layer of the second cladding layer lies between 30 and 40 at. % and its thickness between 1 and 3 $\mu$m, the aluminium content of the third cladding layer lies between 40 and 50 at. % and the wavelength of the emission of the active layer is approximately 0.78 $\mu$m.

7. A radiation-emitting semiconductor diode as claimed in claim 6, characterized in that the aluminium content of the first sub-layer of the first cladding layer lies between 40 and 70 at. % and its thickness between 0.03 and 0.2 $\mu$m, the aluminium content of the second sub-layer of the first cladding layer lies between 30 and 40 at. % and its thickness between 1 and 3 $\mu$m.

8. A radiation-emitting semiconductor diode as claimed in claim 5, characterized in that the aluminium content of the first sub-layer of the second cladding layer lies between 30 and 50 at. % and its thickness between 0.03 and 0.2 $\mu$m, the aluminium content of the second sub-layer of the second cladding layer lies between 15 and 30 at. % and its thickness between 1 and 3 $\mu$m, the aluminium content of the third cladding layer lies between 20 and 40 at. %, and the wavelength of the emission of the active layer is approximately 0.98 $\mu$m.

9. A radiation-emitting semiconductor diode as claimed in claim 8, characterized in that the aluminium content of the first sub-layer of the first cladding layer lies between 30 and 50 at. % and its thickness between 0.03 and 0.2 $\mu$m, the aluminium content of the second sub-layer of the first cladding layer lies between 15 and 30 at. % and its thickness between 1 and 3 $\mu$m.

10. A radiation-emitting semiconductor diode as claimed in claim 5, characterized in that the aluminium content of the first sub-layer of the first cladding layer is greater than the aluminum content of the second sub-layer of the first cladding layer, while the aluminium content of the third cladding layer lies between that of the first and that of the second sub-layer of the first cladding layer.

11. A radiation-emitting semiconductor diode as claimed in claim 1, characterized in that the strip-shaped region forms a ridge which lies recessed in the third cladding layer.

12. A radiation-emitting semiconductor diode as claimed in claim 11, characterized in that a portion of the second cladding layer situated on either side of the ridge comprises besides the first sub-layer a small portion of the second sub-layer.

13. A radiation-emitting semiconductor diode as claimed in claim 12, characterized in that the portion of the second cladding layer situated on either side of the ridge also comprises an intermediate layer situated between the first sub-layer and the small portion of the second sub-layer.

* * * * *